(12) United States Patent
Niu et al.

(10) Patent No.: US 12,217,633 B2
(45) Date of Patent: Feb. 4, 2025

(54) DISPLAY PANEL AND MANUFACTURING METHOD THEREOF, DISPLAY APPARATUS

(71) Applicant: BOE Technology Group Co., Ltd., Beijing (CN)

(72) Inventors: Yanan Niu, Beijing (CN); Hongwei Tian, Beijing (CN); Zhongyuan Sun, Beijing (CN); Jing Niu, Beijing (CN); Lei Chen, Beijing (CN); Wei Huang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1153 days.

(21) Appl. No.: 17/041,811

(22) PCT Filed: Feb. 11, 2020

(86) PCT No.: PCT/CN2020/074702
§ 371 (c)(1),
(2) Date: Sep. 25, 2020

(87) PCT Pub. No.: WO2020/164467
PCT Pub. Date: Aug. 20, 2020

(65) Prior Publication Data
US 2021/0027674 A1      Jan. 28, 2021

(30) Foreign Application Priority Data

Feb. 11, 2019   (CN) .......................... 201910109896.X (51) Int. Cl.
*G09F 9/30*       (2006.01)
*H10K 71/00*   (2023.01)
(Continued)

(52) U.S. Cl.
CPC ............. *G09F 9/301* (2013.01); *H10K 71/00* (2023.02); *H10K 77/111* (2023.02); *H10K 2102/311* (2023.02)

(58) Field of Classification Search
CPC ................. H10K 71/00; H10K 77/111; H10K 2102/311; H10K 71/80; H10K 2102/331;
(Continued)

(56) References Cited

U.S. PATENT DOCUMENTS 9,343,213 B2 *   5/2016   Peng ..................... H01F 7/0215
9,829,922 B2 * 11/2017   Hong .................... G06F 1/1652
(Continued)

FOREIGN PATENT DOCUMENTS

CN        105428393 A      3/2016
CN        105870327 A      8/2016
(Continued)

OTHER PUBLICATIONS

First Office Action with Search Report dated Feb. 25, 2020 corresponding to Chinese application No. 201910109896.X.
(Continued)

*Primary Examiner* — Joshua L Schwartz
*Assistant Examiner* — Tiberiu Dan Onuta
(74) *Attorney, Agent, or Firm* — Nath, Goldberg & Meyer; Joshua B. Goldberg (57) ABSTRACT

The present disclosure provides a display panel and a manufacturing method of the display panel, and a display apparatus, and belongs to the field of display technology. The display panel of the present disclosure includes a flexible substrate and a support substrate, wherein the support substrate supports the flexible substrate; a plurality of display units are provided on the flexible substrate; the display panel further includes: a first magnetic unit; a second magnetic unit; the first magnetic unit and the second mag-
(Continued)

netic unit are used for jointing the flexible substrate to the support substrate through a magnetic field therebetween.

17 Claims, 4 Drawing Sheets

(51) Int. Cl.
*H10K 77/10* (2023.01)
*H10K 102/00* (2023.01)

(58) Field of Classification Search
CPC ........ Y02E 10/549; Y02P 70/50; G09F 9/301; G09F 9/335
See application file for complete search history.

(56) References Cited

U.S. PATENT DOCUMENTS

| | | | | |
|---|---|---|---|---|
| 2007/0120468 A1* | 5/2007 | Lee | ................ | H10K 71/166 313/504 |
| 2008/0198439 A1* | 8/2008 | Cho | ................ | G02F 1/091 359/280 |
| 2016/0018694 A1* | 1/2016 | Zhou | ................ | G02F 1/13394 445/58 |
| 2016/0104561 A1* | 4/2016 | Noh | ................ | C23C 14/042 427/127 |
| 2016/0306392 A1* | 10/2016 | Park | ................ | G06F 3/041 |
| 2017/0279057 A1* | 9/2017 | Park | ................ | H10K 59/18 |
| 2018/0123059 A1* | 5/2018 | Yang | ................ | H10K 71/00 |
| 2018/0226609 A1* | 8/2018 | Li | ................ | H10K 71/80 |
| 2019/0107911 A1* | 4/2019 | Zhai | ................ | H10K 59/40 |
| 2019/0181195 A1* | 6/2019 | Wang | ................ | H10K 59/173 |
| 2019/0289721 A1* | 9/2019 | Lin | ................ | G06F 1/1652 |
| 2020/0106030 A1* | 4/2020 | Bi | ................ | H10K 71/80 |

FOREIGN PATENT DOCUMENTS

| | | |
|---|---|---|
| CN | 106128312 A | 11/2016 |
| CN | 206388706 U | 8/2017 |
| CN | 107221550 A | 9/2017 |
| CN | 108766982 A | 11/2018 |
| CN | 108807469 A | 11/2018 |
| CN | 108831297 A | 11/2018 |
| CN | 109189265 A | 1/2019 |
| CN | 109285455 A | 1/2019 |
| CN | 109308850 A | 2/2019 |
| CN | 109817098 A | 5/2019 |
| KR | 20100079098 A | 7/2010 |
| WO | 2018006760 A1 | 1/2018 |

OTHER PUBLICATIONS

Second Office Action with Search Report dated Sep. 10, 2020 corresponding to Chinese application No. 201910109896.X.

* cited by examiner

DISPLAY PANEL AND MANUFACTURING METHOD THEREOF, DISPLAY APPARATUS

CROSS REFERENCE TO RELATED APPLICATIONS

This is a National Phase Application filed under 35 U.S.C. 371 as a national stage of PCT/CN2020/074702, filed Feb. 11, 2020, an application claiming the benefit of, Chinese Patent Application No. 201910109896.X filed on Feb. 11, 2019, the content of each of which is incorporated herein by reference in their entirety.

TECHNICAL FIELD

The present disclosure relates to the field of display technology, and in particular to a display panel and a manufacturing method thereof, and a display apparatus.

BACKGROUND

An OLED (Organic Light-Emitting Diode) display panel gradually becomes a mainstream of the display field by virtue of its excellent properties such as a low power consumption, a high color saturation, a wide viewing angle, a thin thickness, and a capability of realizing a flexibility, and is widely applied to a terminal product such as a smart phone, a tablet computer, a television, and the like. A flexible OLED display panel becomes a mainstream of the OLED display by virtue of satisfying various special structures.

SUMMARY

The disclosure provides a display panel and a manufacturing method thereof, a display apparatus.

The display panel includes a flexible substrate and a support substrate, wherein the support substrate supports the flexible substrate; a plurality of display units are provided on the flexible substrate; the display panel further includes: a first magnetic unit attached to the flexible substrate; a second magnetic unit attached to the support substrate; the first magnetic unit and the second magnetic unit are used for jointing the flexible substrate to the support substrate through a magnetic field therebetween.

In an embodiment, the first magnetic unit includes a plurality of first magnetic devices; the plurality of first magnetic devices are provided at a side of the flexible substrate distal to the display units, and there is one-to-one correspondence between the plurality of first magnetic devices and the display units.

In an embodiment, a plurality of first grooves are provided at a side of the flexible substrate distal to the display units, and there is one-to-one correspondence between the plurality of first grooves and the plurality of display units; each of the plurality of first magnetic devices is provided in a corresponding one first groove.

In an embodiment, the first magnetic unit includes a plurality of first magnetic devices; the first magnetic devices are provided at a side of the flexible substrate proximal to the display units, and there is one-to-one correspondence between the plurality of first magnetic devices and the display units.

In an embodiment, the display panel includes a plurality of display regions and spacer regions between the display regions; the display units are provided in the display regions; the spacer regions include connection portions and hollow portions; the first magnetic unit includes magnetic membranes, and the magnetic membranes are provided on the connection portions and/or the hollow portions of the spacer regions.

In an embodiment, the magnetic membranes each include an elastic magnetic membrane.

In an embodiment, a material of the first magnetic unit includes silica gel doped with magnetic particles.

In an embodiment, the magnetic particles include magnetic $Fe_3O_4$ nano-microspheres, magnetic NiFe nano-microspheres, or quantum dot microspheres.

In an embodiment, the first magnetic devices include magnetic coils or magnetic metals.

In an embodiment, the second magnetic unit is provided on a side of the support substrate proximal to the flexible substrate, and the second magnetic unit is provided opposite to the first magnetic unit.

In an embodiment, the second magnetic unit includes a plurality of second magnetic devices, and the second magnetic devices are magnetic coils or magnetic metals.

In an embodiment, a plurality of second grooves are provided on a side of the support substrate proximal to the flexible substrate, and there is one-to-one correspondence between the plurality of second grooves and the plurality of display units; each of the plurality of second magnetic devices is provided in a corresponding one second groove.

In an embodiment, the plurality of second magnetic devices are provided on the support substrate; and the display panel further includes a stretchable back membrane provided between the support substrate and the flexible substrate.

In an embodiment, the support substrate and the second magnetic unit are integrally formed of a magnetic metal as a single piece; and the display panel further includes a stretchable back membrane provided between the support substrate and the flexible substrate.

In an embodiment, the first magnetic devices are electromagnetic coils and/or the second magnetic devices are electromagnetic coils; the display panel further includes a power supply for applying a current to the electromagnetic coils.

In an embodiment, a surface of the support substrate for supporting the flexible substrate is an arc surface.

The present disclosure also provides a method for manufacturing the above display panel, including following steps of: forming a flexible substrate such that a plurality of display units are formed on the flexible substrate; forming a support substrate; forming a first magnetic unit attached to the flexible substrate at a side of the flexible substrate; forming a second magnetic unit attached to the support substrate at a side of the support substrate; and assembling the flexible substrate and the support substrate, such that the support substrate supports the flexible substrate, and the flexible substrate and the support substrate are jointed together through a magnetic field between the first magnetic unit and the second magnetic unit.

In an embodiment, the first magnetic unit includes a plurality of first magnetic devices; the step of forming a flexible substrate includes following steps of: forming a plurality of grooves in display regions on a first side of the flexible substrate by a patterning process; forming a plurality of display units on a second side of the flexible substrate opposite to the first side, such that there is one-to-one correspondence between the plurality of display units and the plurality of grooves; forming the plurality of first magnetic devices in the plurality of grooves, respectively.

In an embodiment, the step of forming a second magnetic unit attached to the support substrate at a side of the support substrate includes following steps of: forming a plurality of second magnetic devices on the support substrate at positions corresponding to the plurality of first magnetic devices; and forming a stretchable back membrane on the support substrate; and the step of assembling the flexible substrate with the support substrate includes a step of mounting the flexible substrate on the stretchable back membrane.

The present disclosure also provides a display apparatus including the above display panel.

DETAIL DESCRIPTION OF EMBODIMENTS

In order that those skilled in the art will better understand technical solutions of the present disclosure, the present disclosure will be described below in detail with reference to the accompanying drawings and the detailed description.

With a development of a flexible process, an OLED display panel gradually changes from being bendable or foldable to being elastically stretchable, which is suitable for a spherical display or a stereoscopic display. In the related stretchable OLED display panel, a display island-connection bridge-gap structure is employed. In a stretching process of the OLED display panel, a shape of the gap may be changed, and the display island may be subjected to a shear stress of the connection bridge, so that the display island is often distorted. The display island is distorted, which may cause bad performances, such as a display mura, a pattern distortion, an aliasing and the like of the OLED display panel.

Figure 1A:
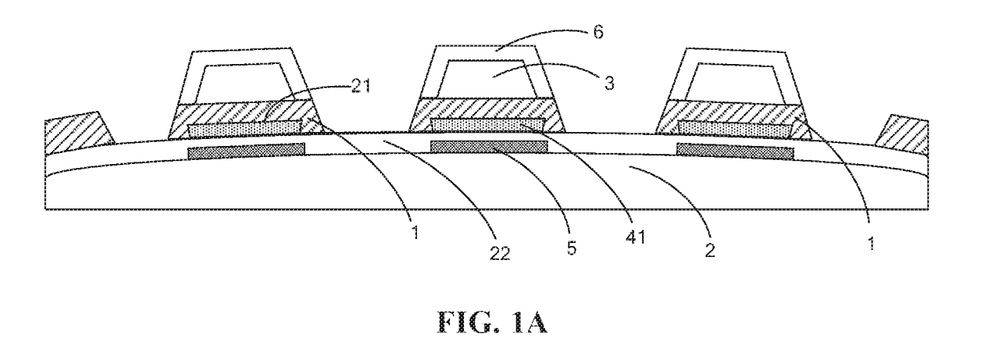
FIG. 1A is a schematic cross-sectional view of a structure of a display panel according to an embodiment of the present disclosure.
Figure 1B:
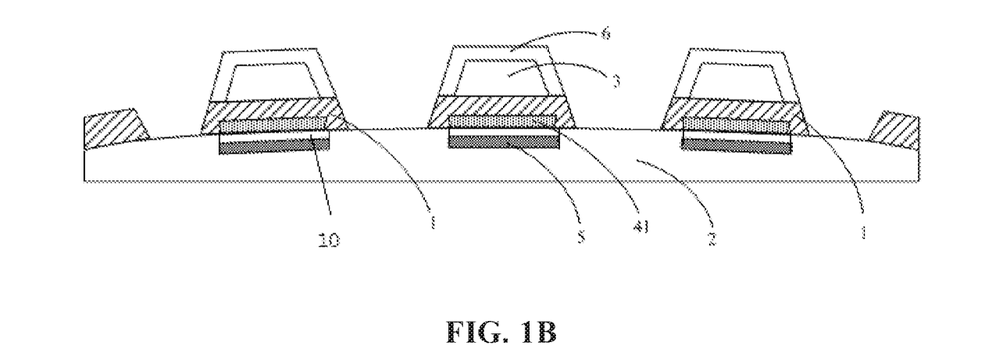
FIG. 1B is a schematic cross-sectional view of a structure of a display panel according to an embodiment of the present disclosure.
Figure 1C:
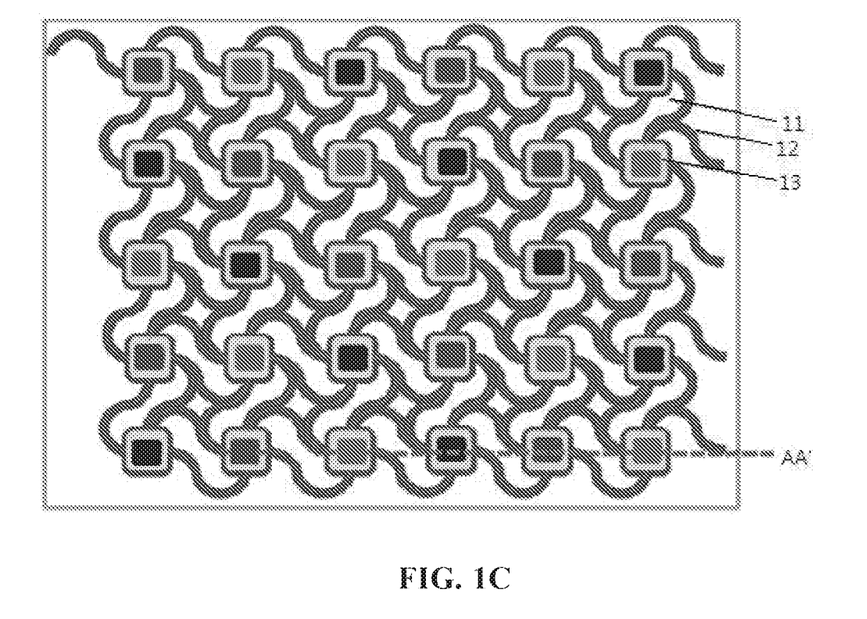
FIG. 1C is a plan view of a structure of a display panel according to an embodiment of the present disclosure.

The display panel provided by the embodiment of the present disclosure is particularly suitable for a stretchable display panel. As shown in FIG. 1A, the stretchable display panel includes a flexible substrate 1 and a support substrate 2. As shown in FIG. 1C, the flexible substrate 1 includes: a plurality of display regions 13 (may also be referred to as display islands) and spacer regions located between the display regions 13. The spacer regions of the flexible substrate 1 generally include hollow portions 11 and connection portions 12, and adjacent display regions are separated by the hollow portions 11 and connected by the connection portions 12. As shown in FIGS. 1A and 1C, a display unit, which may include one or more display devices 3, is provided in each display region 13. In the embodiment of the present disclosure, an example is described in which the display unit includes only one display device 3. The display device 3 may be an organic light-emitting diode or an inorganic light-emitting diode, and a type of the display device 3 is not limited in the embodiment of the present disclosure.

As shown in FIGS. 1A and B, the present embodiment provides a display panel including a flexible substrate 1 and a support substrate 2 for supporting the flexible substrate 1; a display unit is provided in a display region of the flexible substrate 1. The display panel further includes: a first magnetic unit and a second magnetic unit; the first magnetic unit and the second magnetic unit are used for jointing the flexible substrate 1 to the support substrate 2 through a magnetic field therebetween.

The display panel is stretched, which may change a shape of the hollow portion of the spacer region of the flexible substrate 1 to adapt for the stretching of the display panel. And, the display region of the flexible substrate 1 is easily distorted, so that light-emitting directions of the display devices 3 on the flexible substrate 1 are different, and thus a poor display is caused. In this embodiment, by providing the first magnetic unit and the second magnetic unit in the display panel, through a magnetic field (magnetic field force) between the first magnetic unit and the second magnetic unit, the flexible substrate 1 and the support substrate 2 are jointed together due to the magnetic field when the display panel is stretched, thereby preventing the display region of the flexible substrate 1 from being distorted, while guaranteeing a jointing nature and a stability of the flexible substrate 1 and the support substrate in each display region, and further guaranteeing that the display panel has a good display effect.

It is noted that the magnetic field in the present embodiment is a low-intensity (the intensity is enough for balancing the shear stress, for example, the intensity is 0.01 H to 10 H) constant magnetic field or a low-frequency magnetic field. According to Maxwell's electromagnetic wave theory, a changing magnetic field will generate an electric field, and an interference of the magnetic field to a circuit is mainly caused by electromagnetic waves generated by the change of the magnetic field, the low-frequency magnetic field or the constant magnetic field in this embodiment will not radiate electromagnetic waves to the outside, and the low-intensity magnetic field will not have a great influence on the circuit in the display panel, i.e. a normal display of the display panel will not be influenced. Of course, an electromagnetic shielding structure (a whole layer of metal is added (grounded or connected to a constant voltage)) may be provided in the display panel, to prevent the magnetic field between the first magnetic unit and the second magnetic unit from affecting the display apparatus, a driving circuit, and the like.

Figure 1D:
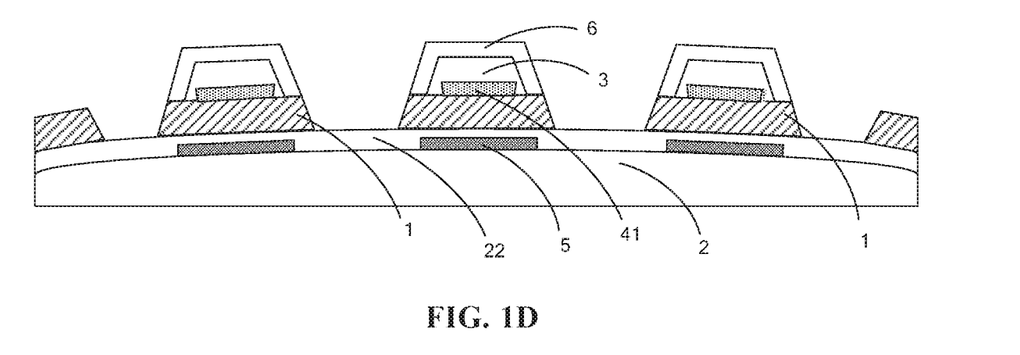
FIG. 1D is a schematic cross-sectional view of a structure of a display panel according to an embodiment of the present disclosure.
Figure 1E:
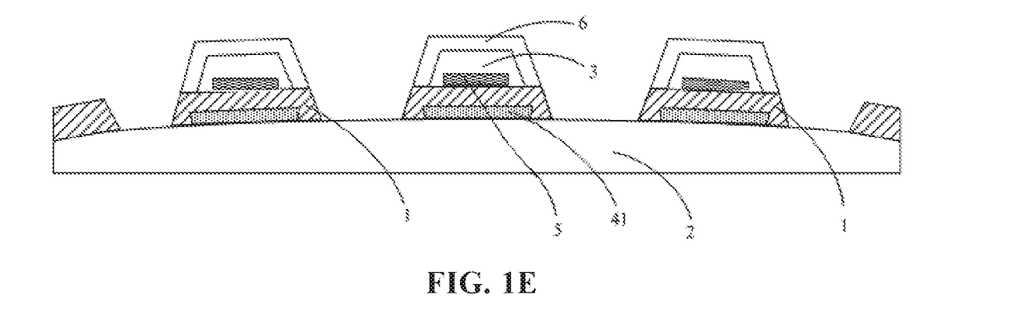
FIG. 1E is a schematic cross-sectional view of a structure of a display panel according to an embodiment of the present disclosure.

In the embodiment of the present disclosure, the first magnetic unit may be provided at a side of the flexible substrate 1, attached to the flexible substrate 1; the second magnetic unit may be provided at a side of the support substrate 2, attached to the support substrate 2, and corresponding to the first magnetic unit to form a magnetic field. The flexible substrate 1 and the support substrate 2 are jointed together through an attractive force between the first magnetic unit and the second magnetic unit, as shown in FIGS. 1A, 1B, and 1D; alternatively, the first magnetic unit may be provided at a side of the flexible substrate 1 and attached to the flexible substrate 1, and the second magnetic unit may be correspondingly provided at a side of the flexible substrate 1 distal to the support substrate 2 and attached to the support substrate 2. The flexible substrate 1 and the support substrate 2 are jointed together through a use of a repelling force between the first magnetic unit and the second magnetic unit, as shown in FIG. 1E. The second magnetic unit corresponding to the first magnetic unit means an orthographic projection of the first magnetic unit on the flexible substrate 1 at least partially overlaps an orthographic projection of the second magnetic unit on the flexible substrate 1, and in some embodiments, an orthographic projection of the first magnetic unit on the flexible substrate 1 completely overlaps an orthographic projection of the second magnetic unit on the flexible substrate 1.

In this embodiment, an example is described in which the first magnetic unit is provided at a side of the flexible substrate 1 and attached to the flexible substrate 1, and the second magnetic unit is provided at a side of the support substrate 2 and attached to the support substrate 2, as shown in FIG. 1A.

The first magnetic unit may include a plurality of first magnetic devices 41; each first magnetic device 41 may be provided on a side of the flexible substrate 1 distal to the display unit, and there is one-to-one correspondence between the first magnetic devices 41 and the display units. The second magnetic unit may include a plurality of second magnetic devices 5, such as magnetic coils or magnetic metals, which may be provided on the support substrate 2, and there is one-to-one correspondence between the second magnetic devices 5 and the first magnetic devices 41. As shown in FIG. 1A, the support substrate 2 is located on a side of the flexible substrate 1 distal to the display unit, and the first magnetic device 41 is provided on a side of the flexible substrate 1 distal to the display unit, so that a magnetic field between the first magnetic device 41 and the second magnetic device 5 has a better effect of facilitating shaping of the flexible substrate 1.

As shown in FIG. 1A, a stretchable back membrane 22 is further provided between the support substrate 2 and the flexible substrate 1, and separates the first magnetic device 41 and the corresponding second magnetic device 5, and the flexible substrate 1 attached to the first magnetic device 41 and the support substrate 2 attached to the second magnetic device 4 may be closely jointed together through an attractive force between the first magnetic device 41 and the corresponding second magnetic device 5. The stretchable back membrane 22 may be made of PDMS or the like.

The present disclosure is not limited to the embodiment in which the second magnetic devices 5 are provided on the support substrate 2 and the stretchable back membrane 22 is provided between the flexible substrate 1 and the support substrate 2 as shown in FIG. 1A. In one embodiment, as shown in FIG. 1B, the second magnetic devices 5 are provided in grooves 10 formed in the support substrate 2, and spaced apart from the first magnetic devices 41.

There may be a one-to-one correspondence between the first magnetic devices 41 and the display units, and particularly, the first magnetic devices 41 may be provided on a side of the display unit proximal to the flexible substrate 1, as shown in FIG. 1D, or on a side of the flexible substrate 1 distal to the display unit, as shown in FIGS. 1A and 1B.

Optionally, the first magnetic devices 41 are provided on a side of the flexible substrate 1 distal to the display units, that is, each display region of the flexible substrate 1 is provided with a first magnetic device 41 on its back surface, so that the first magnetic device 41 is as close as possible to the second magnetic device 5, thereby ensuring that the flexible substrate 1 for each display region and the support substrate 2 are well jointed together, to the greatest extent, and causing light emitting directions of the display devices 3 to be regular and orderly, and because the display devices commonly used in the display panel in the related art are top gate OLED devices, an influence of the magnetic unit formed on the back surface of the flexible substrate 1 on the display panel is smaller.

Particularly, the flexible substrate 1 may be stretched to a desired shape, and then the first magnetic unit and the second magnetic unit are controlled such that a magnetic field is generated therebetween (specifically, generation of the magnetic field may be controlled by providing a power), so that the flexible substrate 1 and the support substrate 2 are well jointed together.

It should be noted that, when the display unit includes a plurality of display devices 3, in the display substrate of the present embodiment, one first magnetic device 41 may correspond to one display device 3, or one first magnetic device 41 may correspond to a plurality of display devices 3 in one display unit.

Further, the first magnetic device 41 is embedded in a back surface of the flexible substrate 1. As shown in FIGS. 1A and 1B, a groove is provided in a surface of the flexible substrate 1 distal to the display unit. There is a one-to-one correspondence between the grooves and the display units. The first magnetic device 41 is arranged in the groove. By providing the groove in the flexible substrate 1 and providing the first magnetic device 41 in the groove, a thickness of the display panel may be prevented from being increased, while the flexible substrate 1 is prevented from being distorted due to stretching, which is beneficial to lightening and thinning of the display panel.

Particularly, a material of the first magnetic device 41 may include a silica gel material doped with magnetic particles. The silica gel material is a printing ink material widely used in the field, a printing effect of which is good, and the silica gel material is firmly jointed to the flexible substrate 1. The flexible substrate 1 and the first magnetic unit may still be firmly attached to each other when the first magnetic unit and the second magnetic unit are attracted or repelled through the magnetic field therebetween. Of course, other printing ink materials are possible, and are not listed in this embodiment. The magnetic particles may be magnetic $Fe_3O_4$ or NiFe nano-microspheres, quantum dot microspheres or the like. Alternatively, the first magnetic device 41 may be a structure such as a magnetic coil, a magnetic metal or the like. The magnetic metal may be a metal having magnetic properties itself, or a metal having magnetic properties after being powered.

The display panel shown in FIG. 1A further includes an electromagnetic shielding structure 21, which may be an entire layer of metal provided on an upper surface of each first magnetic device 41, for shielding an interaction between the first magnetic device 41 and the second magnetic device 5, so as to avoid interference to the display unit.

Figure 1F:
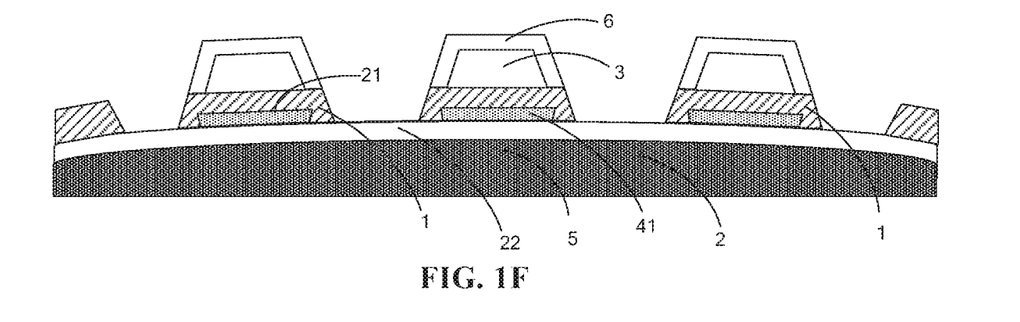
FIG. 1F is a schematic cross-sectional view of a structure of a display panel according to an embodiment of the present disclosure.

FIG. 1F shows a display panel according to an embodiment of the present invention, in which the support substrate is entirely constituted by the second magnetic device 5.

The display panel of FIGS. 1A to 1F further includes an encapsulation element 6 provided on each display device 3 for encapsulating and protecting the entire display device.

Figure 2A:
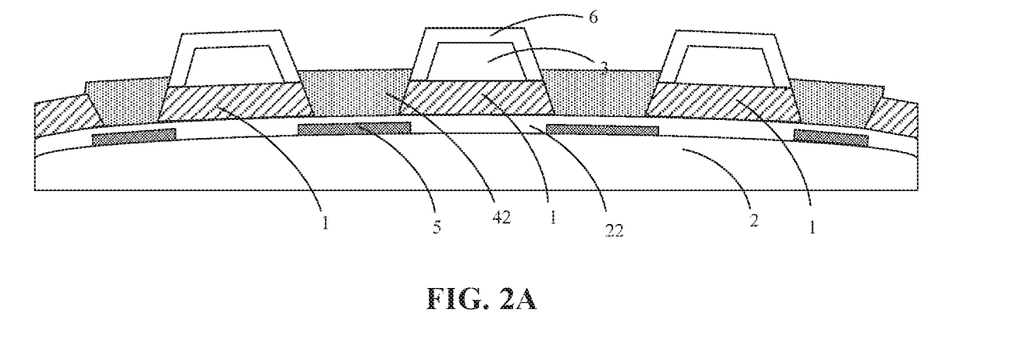
FIG. 2A is a schematic view of a structure of a display panel according to an embodiment of the present disclosure.
Figure 2B:
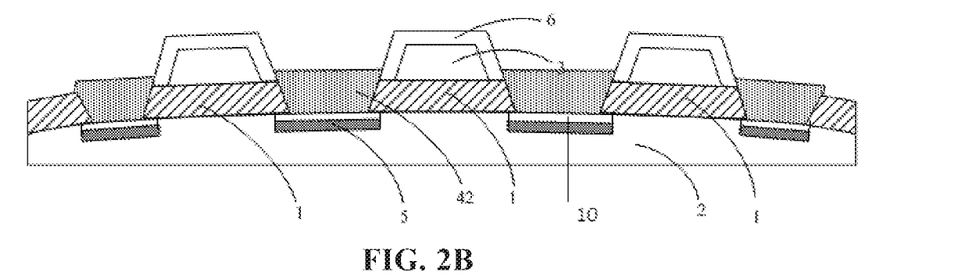
FIG. 2B is a schematic view of a structure of a display panel according to an embodiment of the present disclosure.

As shown in FIGS. 2A and 2B, the present embodiment provides a display panel, wherein the first magnetic unit is provided at a side of the flexible substrate 1 and attached to the flexible substrate 1, and the second magnetic unit is correspondingly provided at a side of the support substrate 2 and attached to the support substrate 2.

In the display panel of the present embodiment, the first magnetic unit may include magnetic membranes 42, which may be provided in spacer regions of the flexible substrate 1.

Specifically, as shown in FIG. 2A, the flexible substrate 1 is a patterned structure, the display device 3 is not provided in the hollow portion, and the first magnetic unit (specifically, the magnetic membranes 42) may be provided in the hollow portions between the display units (i.e., the display regions of the flexible substrate 1). The magnetic membrane 42 with a certain thickness (for example, 0.1 to 10 μm) may fix each display unit in the display substrate at a position. When the display panel is stretched, irregular deflections of the display units may be inhibited by utilizing the magnetic field force between the first magnetic unit and the second magnetic unit, so that the flexible substrate 1 is well jointed to the support substrate 2 while being stretched, and it is further ensured that the display panel has a good display effect.

Of course, in this embodiment, the magnetic membranes 42 may also be provided at the connection portions of the flexible substrate 1, and the magnetic membranes 42 at the connection portions enables the flexible substrate to be well jointed to the support substrate 2, thereby inhibiting the flexible substrate 1 in the display region from being deflected, and enabling the flexible substrate 1 to be well jointed to the support substrate 2 as a whole.

Alternatively, in the present embodiment, the magnetic membrane 42 has elasticity. The elastic magnetic membrane 42 may be better adapted for the stretching of the display panel, so that the deformation of the hollow portions may be well adapted during the stretching of the display panel, and the deflection of the display unit may be effectively limited.

Specifically, a material of the magnetic membrane 42 in this embodiment may alternatively be silica gel doped with magnetic particles. The magnetic particles may be magnetic $Fe_3O_4$ or NiFe nano-microspheres, quantum dot microspheres or the like.

Other structures of the second magnetic device in FIGS. 2A and 2B are similar to those in FIGS. 1A and 1B, and are not repeated herein.

As shown in FIGS. 3 to 6, the present embodiment provides a method for manufacturing a display panel, which may be used for manufacturing the display panel provided in FIG. 1A. The manufacturing method may include the following steps of: forming a flexible substrate 1, forming a plurality of display units on the flexible substrate 1, forming a support substrate 2 (the support substrate 2 is used for supporting the flexible substrate 1), and forming a first magnetic unit and a second magnetic unit to attach the flexible substrate 1 to the support substrate 2 through a magnetic field between the first magnetic unit and the second magnetic unit.

Figure 7:
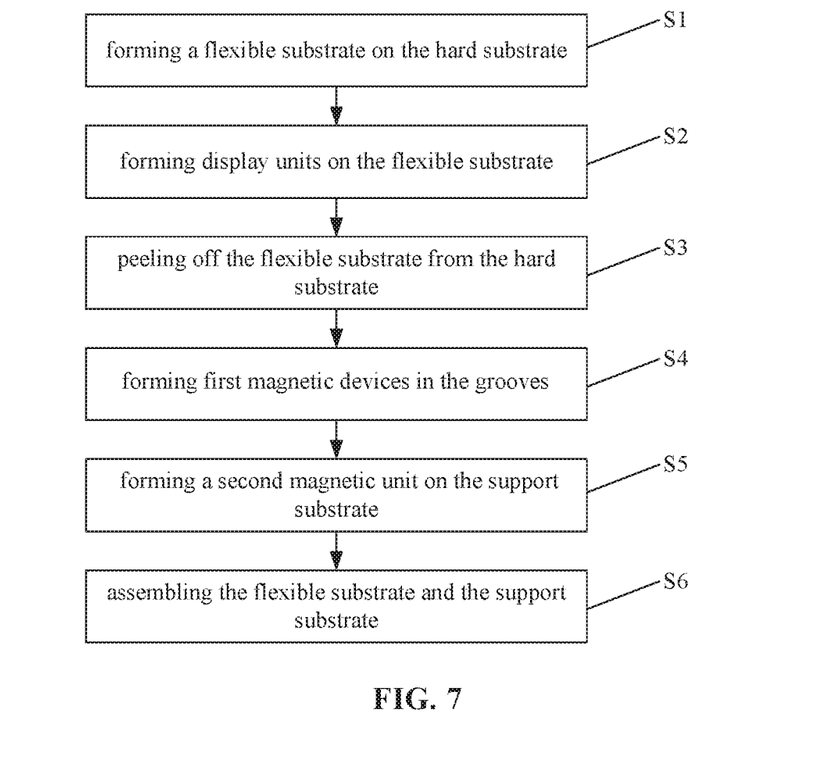
FIG. 7 shows a flowchart of a method for manufacturing a display panel according to the present disclosure.

An example of the method for manufacturing the display panel in FIG. 1A is described below in detail, the first magnetic device 41 is provided on a side of the flexible substrate 1 distal to the display unit, and the method may particularly include the following steps S0 to S6, as shown in FIG. 7.

Figure 3:
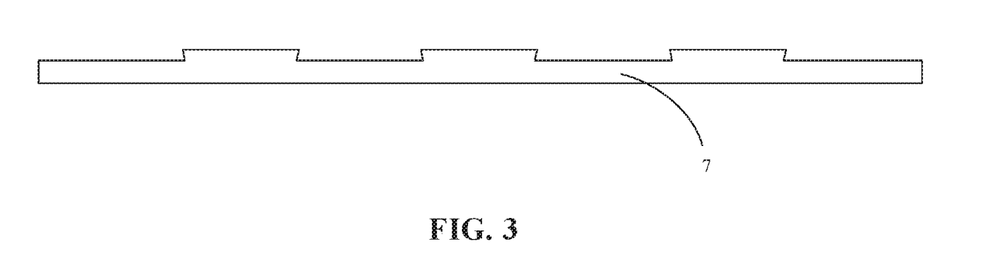
FIG. 3 is a schematic view illustrating forming a hard substrate in a method for manufacturing a display panel according to an embodiment of the present disclosure.

In step S0, as shown in FIG. 3, a hard substrate 7 is formed to have projections.

Specifically, the hard substrate 7 having the projections at predetermined positions may be formed by a patterning process (film forming, photoresist coating, etching, etc.). The hard substrate 7 is used for forming the flexible substrate 1, and the positions where the projections are provided may correspond to the display regions of the flexible substrate 1. The hard substrate 7 may be a glass substrate, a silicon substrate, or the like. The cross section of the projection may have a shape of an inverted trapezoid.

Figure 4:
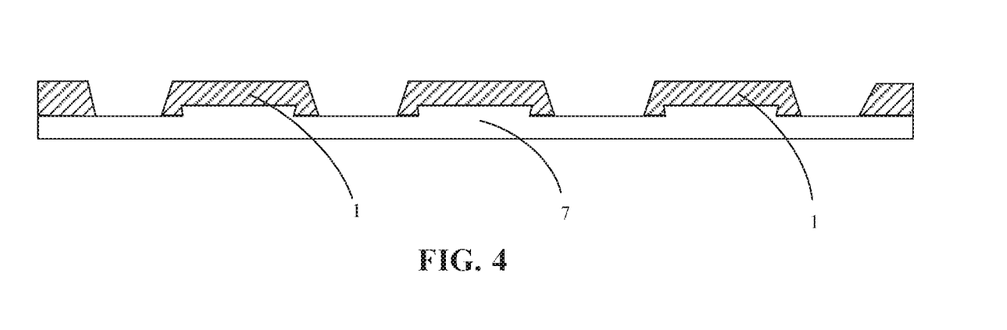
FIG. 4 is a schematic view illustrating forming a flexible substrate in a method for manufacturing a display panel according to an embodiment of the present disclosure.

In step S1, as shown in FIG. 4, a flexible substrate 1 is formed on the hard substrate 7.

In this step, a material layer of the flexible substrate 1 may be formed on the hard substrate 7 by a coating process, and the flexible substrate 1 is patterned by a curing process. The flexible substrate 1 includes a plurality of display regions and spacer regions located between the display regions. The flexible substrate 1 has two opposite first and second sides, the first side is adjacent to the hard substrate 7 and the second side is away from the hard substrate 7.

Figure 5:
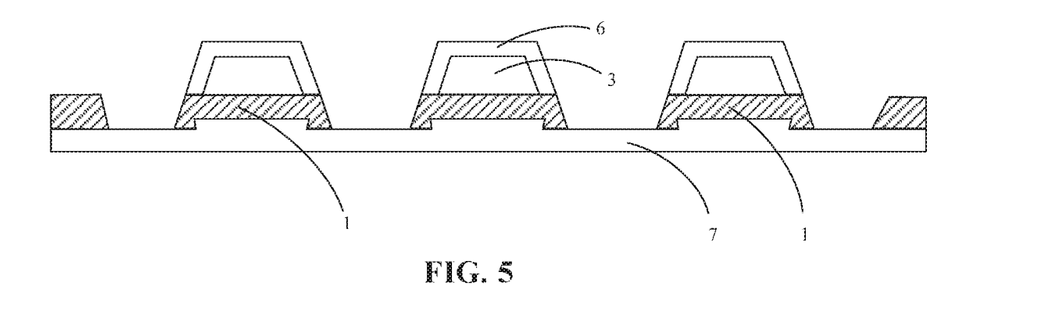
FIG. 5 is a schematic view illustrating forming an OLED device in a method for manufacturing a display panel according to an embodiment of the present disclosure.

In step S2, as shown in FIG. 5, display units are formed on the second side of the flexible substrate 1.

The display unit may include one or more display devices 3, such as an OLED display device 3. Of course, the display unit may further include an encapsulation element 6, a thin film transistor, and the like. Processes of forming each structure in the display unit may refer to related technology, and is not described in detail in this embodiment.

In step S3, the flexible substrate 1, on which the display units are formed, is peeled from the hard substrate 7 and is turned upside down.

It should be understood that, grooves are formed on the first side of the peeled off flexible substrate 1 at positions where the projections are provided on the hard substrate 7, and the positions of the grooves correspond to the display units provided on the first side of the flexible substrate 1.

Figure 6:
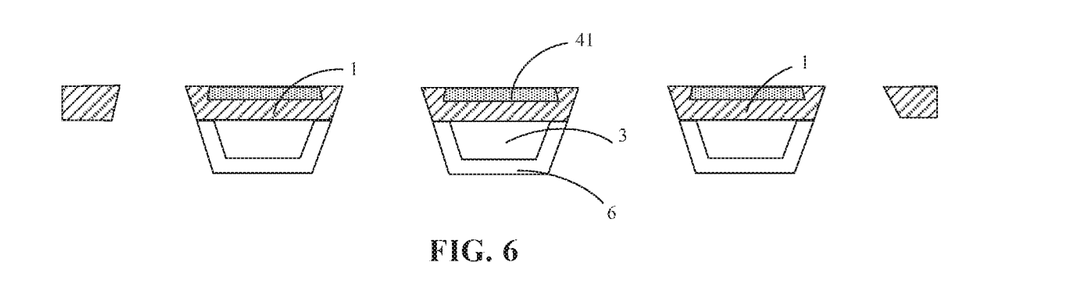
FIG. 6 is a schematic view illustrating forming a first magnetic device in a method for manufacturing a display panel according to an embodiment of the present disclosure.

In step S4, as shown in FIG. 6, first magnetic devices 41 are formed in the grooves, respectively.

A material of the first magnetic device 41 may include silica gel doped with magnetic particles. Specifically, in this step, a solution of silica gel doped with magnetic particles may be formed in the grooves by an ink printing process, and the first magnetic devices 41 may be formed by a curing process. Of course, when the first magnetic devices 41 are of other types of magnetic structures, the first magnetic devices may be formed in other ways.

In step S5, a second magnetic unit is formed on the support substrate 2.

The second magnetic unit may include a magnetic coil or a magnetic metal provided on the support substrate 2.

Optionally, a support surface of the support substrate for supporting the flexible substrate 1 is an arc surface.

In step S6, the flexible substrate 1 and the support substrate 2 are assembled.

In this embodiment, a stretchable back membrane may be coated on the support substrate 2 provided with the second magnetic unit, and then the support surface of the support substrate may be directly used to stretch the flexible substrate 1. After the flexible substrate 1 is stretched, the flexible substrate 1 is shaped through the magnetic field between the first magnetic unit and the second magnetic unit, so that the flexible substrate 1 is jointed to the support substrate 2. Of course, the flexible substrate 1 may be shaped through the magnetic field between the first magnetic unit and the second magnetic unit while the flexible substrate 1 is stretched.

It should be noted that, when the display panel provided in FIGS. 2A and 2B is manufactured, it is not necessary to provide the hard substrate 7 having the projections, but it is only necessary to form magnetic membranes at the spacer regions of the flexible substrate 1 thereby forming the first magnetic unit, after the flexible substrate 1 is formed on a flat hard substrate 7, and display units, thin film transistors, encapsulation elements, and the like are formed. The magnetic membranes may be formed by an ink printing process and a curing process. The formation of the second magnetic unit and the assembly of the flexible substrate 1 and the support substrate 2 may be completed with reference to the above steps (steps S5, S6), and are not repeated herein.

The display panel manufactured by the method provided by the embodiment is provided with the first magnetic unit and the second magnetic unit. When the display panel is stretched through the magnetic field (magnetic field force) between the first magnetic unit and the second magnetic unit, the flexible substrate 1 and the support substrate 2 are jointed together, to prevent the display regions of the flexible substrate 1 from being distorted, thereby fixing the flexible substrate 1 of the display regions in a certain range, and ensuring that the display panel has a good display effect.

Embodiment 4

The present embodiment provides a display apparatus including any one of the display panels provided in FIG. 1 or FIG. 2.

The display apparatus may be an OLED display apparatus, such as any product or component with a display function, such as a mobile phone, a tablet computer, a television, a display, a notebook computer, a digital photo frame, a navigator, and the like.

It should be understood that, the above embodiments are merely exemplary embodiments employed to illustrate the principles of the present disclosure, and the present disclosure is not limited thereto. It will be apparent to those skilled in the art that various changes and modifications may be made herein without departing from the spirit and scope of the present disclosure, and these changes and modifications are to be considered within the scope of the present disclosure.

What is claimed is:

1. A display panel, comprising:
a flexible substrate, comprising a plurality of display units in a plurality of display regions and a plurality of spacer regions between the plurality of display regions, wherein the plurality of spacer regions comprise a plurality of hollow portions and a plurality of connection portions, and two adjacent display regions are separated by a hollow portion and connected by a connection portion;
a support substrate which is configured to support the flexible substrate;
a first magnetic unit which is attached to the flexible substrate;
a second magnetic unit which is attached to the support substrate;
wherein the first magnetic unit comprises a plurality of first magnetic devices, each first magnetic device of the plurality of first magnetic devices is entirely provided at a corresponding display region of the plurality of display regions, and has an orthographic projection on the flexible substrate at least partially overlapping with an orthographic projection of a display unit in the corresponding display region;
the plurality of first magnetic devices are provided at a side of the flexible substrate away from the plurality of display units, and provided at the plurality of display regions, respectively, and there is one-to-one correspondence between the plurality of first magnetic devices and the plurality of display units; and
the second magnetic unit comprises a plurality of second magnetic devices on the support substrate at positions corresponding to the plurality of first magnetic devices, wherein the first magnetic device and the second magnetic device corresponding to each display unit of the plurality of display units are at least partially overlapped with each other to form a magnetic field to join the flexible substrate and the support substrate together.

2. The display panel of claim 1, wherein a plurality of first grooves are provided at a side of the flexible substrate away from the display units, and there is one-to-one correspondence between the plurality of first grooves and the plurality of display units; and
each of the plurality of first magnetic devices is provided in a corresponding one first groove.

3. The display panel of claim 1, wherein the first magnetic devices each comprise a magnetic coil or a magnetic metal.

4. The display panel of claim 1, wherein a surface of the support substrate for supporting the flexible substrate is an arc surface.

5. A display device, comprising the display panel of claim 1.

6. The display panel of claim 1, wherein a material of the first magnetic unit comprises silica gel doped with magnetic particles.

7. The display panel of claim 6, wherein the magnetic particles comprise magnetic $Fe_3O_4$ nano-microspheres, magnetic NiFe nano-microspheres, or magnetic quantum dot nano-microspheres.

8. The display panel of claim 1, wherein the second magnetic unit is provided at a side of the support substrate close to the flexible substrate, and the second magnetic unit is arranged opposite to the first magnetic unit.

9. The display panel of claim 8, wherein the support substrate and the second magnetic unit are integrally formed of a magnetic metal as a single piece; and
the display panel further comprises a stretchable back membrane provided between the support substrate and the flexible substrate.

10. The display panel of claim 8, wherein the second magnetic devices each comprise a magnetic coil or a magnetic metal.

11. The display panel of claim 10, wherein a plurality of second grooves are provided at a side of the support substrate close to the flexible substrate, and there is one-to-one correspondence between the plurality of second grooves and the plurality of display units; and
each of the plurality of second magnetic devices is provided in a corresponding one second groove.

12. The display panel of claim 10, wherein the plurality of second magnetic devices are provided on the support substrate; and
the display panel further comprises a stretchable back membrane provided between the support substrate and the flexible substrate.

13. The display panel of claim 10, wherein the first magnetic devices each are an electromagnetic coil and/or the second magnetic devices each are an electromagnetic coil; and the display panel further comprises a power supply for applying a current to the electromagnetic coil.

14. A display panel, comprising:

a flexible substrate, comprising a plurality of display units in a plurality of display regions and a plurality of spacer regions between the plurality of display regions, wherein the plurality of spacer regions comprise a plurality of hollow portions and a plurality of connection portions, and two adjacent display regions are separated by a hollow portion and connected by a connection portion;

a support substrate which is configured to support the flexible substrate;

a first magnetic unit which is attached to the flexible substrate;

a second magnetic unit which is attached to the support substrate;

wherein the first magnetic unit comprises a plurality of first magnetic devices, each first magnetic device of the plurality of first magnetic devices is entirely provided at a corresponding display region of the plurality of display regions, and has an orthographic projection on the flexible substrate at least partially overlapping with an orthographic projection of a display unit in the corresponding display region;

the plurality of first magnetic devices are provided at a side of the flexible substrate close to the plurality of display units, and provided at the plurality of display regions, respectively, and there is one-to-one correspondence between the plurality of first magnetic devices and the plurality of display units; and the second magnetic unit comprises a plurality of second magnetic devices on the support substrate at positions corresponding to the plurality of first magnetic devices, wherein the first magnetic device and the second magnetic unit corresponding to each display unit of the plurality of display units are at least partially overlapped with each other to form a magnetic field to join the flexible substrate and the support substrate together.

15. A display device, comprising the display panel of claim 14.

16. The display panel of claim 14, wherein a material of the first magnetic unit comprises silica gel doped with magnetic particles.

17. The display panel of claim 14, wherein the first magnetic devices each comprise a magnetic coil or a magnetic metal.

* * * * *